United States Patent
Steber et al.

[19]

[11] Patent Number: 6,163,144
[45] Date of Patent: Dec. 19, 2000

[54] ELECTRICAL CIRCUIT TRACING APPARATUS USING MODULATED TRACING SIGNAL

[75] Inventors: George R. Steber, Mequon; Thomas M. Luebke, Menomonee Falls; David L. Wiesemann, Pewaukee, all of Wis.

[73] Assignee: Applied Power Inc., Waukesha, Wis.

[21] Appl. No.: 09/119,347

[22] Filed: Jul. 20, 1998

[51] Int. Cl.[7] .................. G01R 19/08; G01R 19/145; G01R 31/02
[52] U.S. Cl. .................. 324/67; 324/133; 324/529
[58] Field of Search .................. 324/66, 67, 133, 324/326, 528–530; 379/25

[56] References Cited

U.S. PATENT DOCUMENTS

| | | | |
|---|---|---|---|
| 3,076,931 | 2/1963 | Jasper | 324/66 |
| 3,175,047 | 3/1965 | Borberg | 179/82 |
| 3,531,790 | 9/1970 | Staley | 340/248 |
| 3,623,142 | 11/1971 | Key | 324/66 |
| 3,628,138 | 12/1971 | Collier | 324/66 |
| 3,805,155 | 4/1974 | Tsuda et al. | 324/133 |
| 3,891,811 | 6/1975 | Miller | 179/175.3 A |
| 3,924,179 | 12/1975 | Dozier | 324/66 |
| 3,982,181 | 9/1976 | Ferony et al. | 324/67 X |
| 4,121,152 | 10/1978 | Hale et al. | 324/66 |
| 4,129,825 | 12/1978 | Brinegar | 324/52 |
| 4,556,839 | 12/1985 | George | 324/66 |
| 4,642,556 | 2/1987 | Pecukonis | 324/67 |
| 4,734,638 | 3/1988 | Weber | 324/66 |
| 4,801,868 | 1/1989 | Brooks | 324/66 |
| 4,906,938 | 3/1990 | Konopka | 324/529 |
| 4,998,058 | 3/1991 | Tofte et al. | 324/67 |
| 5,315,255 | 5/1994 | Bettinger | 324/457 |
| 5,418,447 | 5/1995 | Beha et al. | 324/326 X |
| 5,481,185 | 1/1996 | Lane et al. | 324/133 |
| 5,497,094 | 3/1996 | George | 324/529 |
| 5,691,691 | 11/1997 | Merwin et al. | 340/310.02 |

FOREIGN PATENT DOCUMENTS 2 566 539  12/1985  France .
1162811   8/1969   United Kingdom .

OTHER PUBLICATIONS

Applicant's Exhibit A—Ad page entitled "Positive I.D. With Ideal E–Z Check® Plus Circuit Identifier" of Ideal Industries, Inc., Sycamore, IL 60178, admitted prior art. (No Date).

Applicant's Exhibit B—Copy of both sides of packaging backing card of "Circuit Detective" of Northern Continental Technologies and copy of instructions for same. (No Date).

Applicant's Exhibit C—Cover, back, and p. 49 of Amprobe Test & Measurement catalog AC96, dated Feb. 1996, showing Amprobe BT–100 Breaker Tracer.

Applicant's Exhibit D—p. 2 of A.W. Sperry Instruments Inc. catalog showing Model CS–500A Circuit Breaker Finder, and front and back of packaging backing card for same, admitted prior art. No Date.

Applicant's Exhibit E—Copy of Instruction and Safety Manual for Greenlee 2007 Power Finder Circuit Tracer of Greenlee Textron Inc., Rockford, IL, dated Aug. 1992.

*Primary Examiner*—Gerard Strecker
*Attorney, Agent, or Firm*—Quarles & Brady LLP

[57] ABSTRACT

An electrical circuit finder has a transmitter which is plugged into one of the circuits of a building's electrical system and a receiver which is used to identify other elements of the circuit such as a circuit breaker, fuse, switch, electrical device or outlet. The transmitter induces in the circuit a high frequency current signal which is modulated at a lower frequency. The receiver, including a sensor wand and a receiver housing, is tuned to inductively detect the high frequency when placed in the magnetic field of the circuit and to produce visual and audible signals to the user which vary in intensity according to the detected signal. The user can thereby use his or her visual and/or audio senses to associate a circuit element proximate to the receiver with the circuit element connected to the transmitter.

13 Claims, 6 Drawing Sheets

FIG. 3
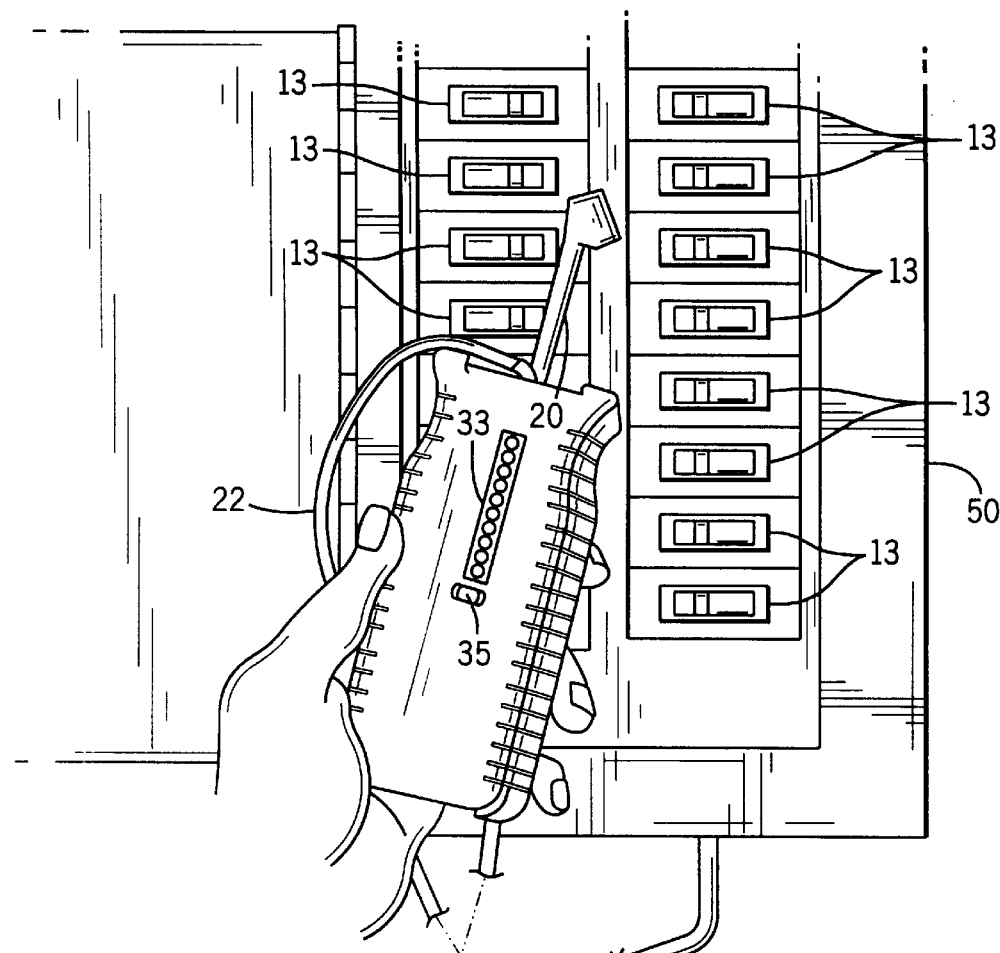
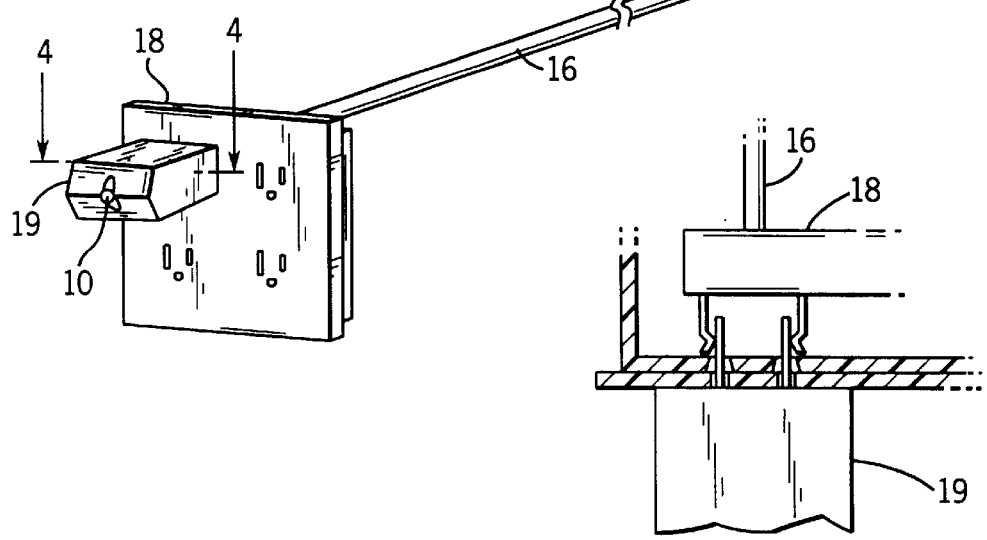
FIG. 4

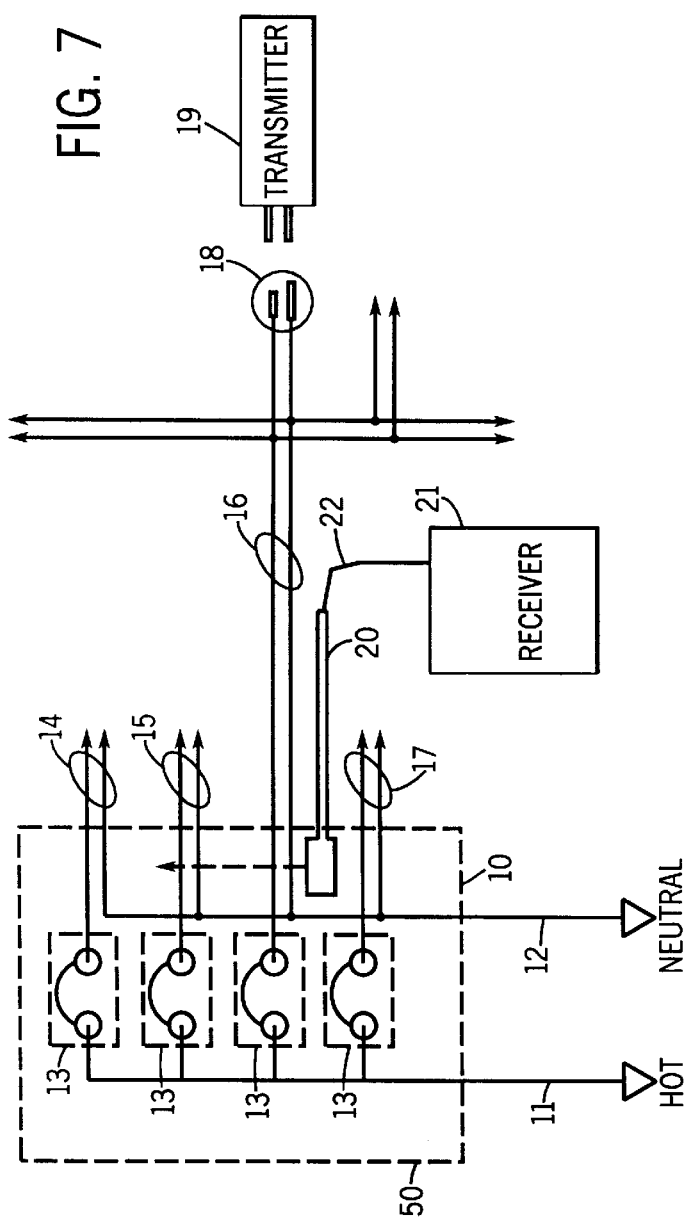
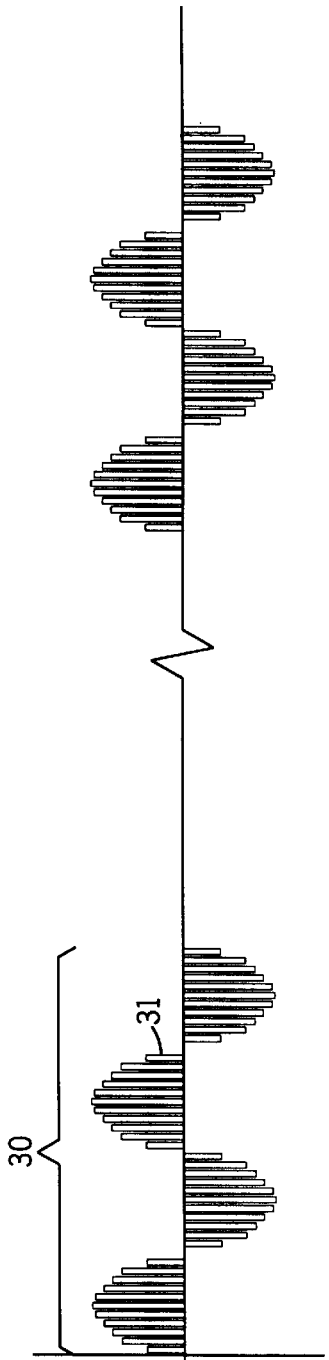

ELECTRICAL CIRCUIT TRACING APPARATUS USING MODULATED TRACING SIGNAL

CROSS REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

This invention relates to electrical instruments for associating elements of an electrical circuit of a building's electrical system and distinguishing different circuits from one another.

2. Discussion of the Prior Art

In electrical work, it is oftentimes necessary to associate different parts of an electrical circuit in a building with one another, or to distinguish one circuit from another. For example, before doing electrical work in one area of a building that has several electrical circuits, one should turn off the electrical circuit interrupter, e.g., a fuse or circuit breaker, that is associated with the particular electrical circuit which serves that area. The different areas of the building are typically wired into an electrical power distribution panel. Such power distribution panels, usually filled with fuses or circuit breakers, are often found near the electrical power service entrance inside a building such as a home, office, apartment, or factory. The interrupter that controls the outlets, light fixtures or other electrical equipment for the desired area must be identified and turned off. As another example, one may want to determine which outlets, switches or other electrical equipment are on the same electrical circuit.

Traditional methods of associating different circuit elements in a building with one another can consume much time through the process of trial and error, can require the services of 2 or more persons, and can produce needless power outages through the inadvertent switching of unrelated circuit interrupters.

There are a number of prior devices for identifying individual circuits in the electrical wiring system of a building. Patents such as U.S. Pat. Nos. 3,076,931, 3,623,142, and 3,924,179, disclose locators that require that the circuits be de-energized or in some way disconnected from the main electrical supply. U.S. Pat. No. 4,121,152 discloses a locator which uses a pulsed load connected to a live outlet, which could cause tripping of GFCI outlets or of the circuit interrupters. The pulsed load can be determined by the use of a clip-on ammeter. This requires opening the control panel and exposing the user to bare conductors therein. It also requires an expensive clip-on ammeter.

U.S. Pat. Nos. 4,906,938 and 5,497,094 disclose circuit locators that use an electrical device known as a SIDAC to generate non-coherent current pulses. There is an associated broadband receiver to receive or detect the pulses at the power panel. The device has a manually operated adjustment dial for the user to operate so as to distinguish one circuit from another. The dial is adjusted while moving the device over the interrupters until the device beeps or lights up when it is in the vicinity of only one interrupter. This device also may encounter difficulty in the presence of electrical noise generated by SCRs or Triacs, which are sometimes used in building electrical equipment, such as light dimming circuits, motor controller circuits, etc.

Other devices are commercially available that use a transmitter that generates short bursts of current derived from crystals, thereby generating a magnetic signature which can be sensed by the receiver. The crystals are relatively expensive, and these devices require a sophisticated generator and associated receiver.

It is desirable that a circuit finder be simple to operate and not require the operator to manually adjust the device. The finder should also permit performing the test without de-energizing the system, as other important electrically operated equipment such as a computer may be on the branch circuit. The device should be able to perform well in the presence of a large amount of electrical noise generated by equipment operating on the circuits and should not cause a circuit breaker or a ground fault circuit interrupter (GFCI) to trip. The device also should not require disassembly of the power panel or circuit element being probed and should be easy and inexpensive to manufacture.

SUMMARY OF THE INVENTION

The invention provides an electrical circuit finder that addresses these needs. The transmitter, which is connected to the circuit to be identified, has an electrical current signal generator including a low frequency oscillator, a high frequency gated oscillator, and a current modulator. The oscillators and modulator are connected so as to induce a high frequency current signal in the circuit which is modulated at the low frequency. The receiver has a circuit including an inductive pick-up which is tuned to the high frequency so as to induce in the pick-up a current of the high frequency when the coil is excited by the magnetic field of the circuit. The receiver also has a relative signal strength indicator which signals to the user of the receiver a human perceptible signal which varies in accordance with the magnitude of the current in the pick-up. Thereby, the user need not adjust the receiver to identify the sought-after circuit, but need only use his or her own sensory perception to determine if the circuit being probed is the one connected to the transmitter, since the uniquely modulating signal produced by the transmitter will be the strongest in that circuit.

The human perceptible signal produced by the receiver may be a visual display and/or an audible signal. If a visual display, it may be an array of LEDs, the number being lit at any point in time depending on the magnitude of the current induced in the pick-up. Preferably the LEDs are arranged in line, with the line of lit LEDs becoming longer for greater detected currents. If an audible signal, the volume of the signal may vary in accordance with the magnitude of the pick-up current, and is preferably similar to a well recognized sound, such as the sound of a cricket chirping, so a user can be told what to listen for.

In another useful aspect of the invention, the pick-up is housed in a wand which is separate from the housing that houses the relative signal strength indicator. The wand can be made relatively small for accurate probing of tightly spaced circuit elements, such as the circuit breakers in a bank of circuit breakers. In this aspect, the housing preferably has magnets with which it can be fixed to the steel door of a circuit breaker box, so that the user need use only one hand to operate the receiver at the circuit breaker box. The magnets can be provided in feet of the housing, which can be formed to hold the wand when not in use, or to hold the wand with its sensor end exposed, as an alternate way for one-handed use.

In addition, the receiver circuit preferably includes a tuned bandpass filter for signal enhancement in noise. The output of the filter may be directed to both an audio output and a filter/detector of a visual display. The audio output produces an audible output by means of an amplifier and loudspeaker. The filter/detector performs additional filtering to eliminate or reduce the effects of electrical noise, and its output is presented to a visual indicator. The visual indicator provides a visual display of the relative strength of the signal detected by lighting an array of lights, the number lit being determined by the signal strength. When probing circuit breakers, for example, the correct circuit breaker is found by seeking the one that produces the loudest signal on the audio output means and also produces the highest reading on the visual indicator as the probe is passed over the power panel.

An electrical circuit finder of the invention can be made using conventional manufacturing methods of relatively low cost components, is simple to use and is reliable in operation. A single individual can locate circuits using the finder without disassembly of electrical components or direct contact with or exposure to conductors, with the building's electrical system fully energized and in the presence of noise. A finder of the invention does not require any adjustment by the user to identify a circuit and uses a unique form of energy distribution in the testing mode that does not cause fault tripping of protective devices on the circuit.

Other features and advantages of the invention will become apparent from the detailed description and drawings.

BRIEF DESCRIPTION OF THE DRAWINGS

FIG. 3 is a perspective view illustrating one way how the finder is used, including the receiver and transmitter;

FIG. 4 is a partial cross-sectional view of the transmitter plugged into an outlet;

FIG. 7 is a partial circuit diagram of a power distribution panel, associated wiring and an indication of how the finder is connected to and used on such a system;

FIG. 9 is a graphical representation of the current waveform produced by the transmitter circuit of FIG. 8.

DETAILED DESCRIPTION OF THE PREFERRED EMBODIMENT

Figure 1:
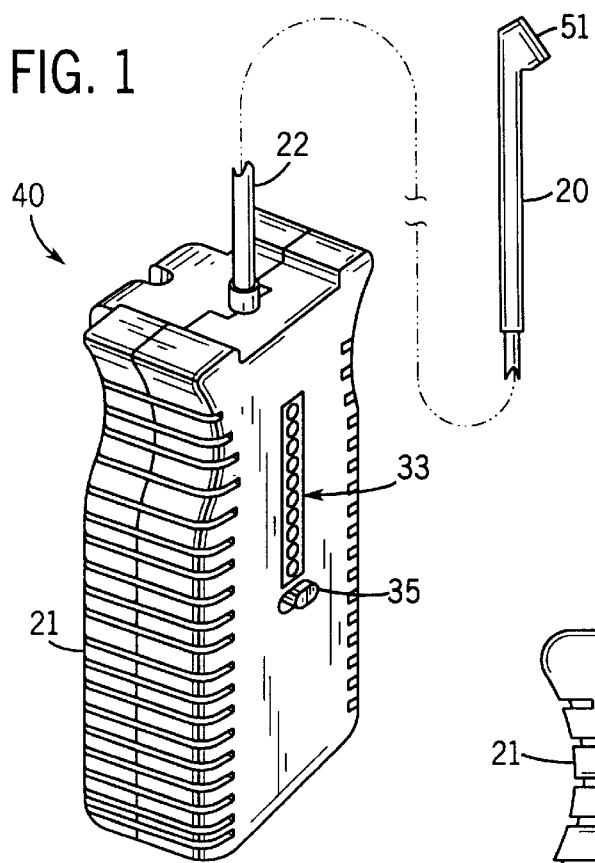
FIG. 1 is a perspective view of an electrical circuit finder receiver incorporating the invention.

Referring to FIG. 7 there is illustrated a simplified diagram of a power distribution panel 10 of a type conventionally employed in dwellings, factories, offices, and the like. The input lines, HOT 11 and NEUTRAL 12, enter the panel and are connected to the circuit interrupters, in this case circuit breakers 13. The principles described herein also apply to panels that have fuse elements instead of circuit breakers. Output line pairs 14, 15, 16 and 17 supply power to various parts of the building. Line pair 16 is connected to a remotely located outlet 18. Other outlets, light fixtures or electrical equipment may also be connected to pair 16, as indicated by the two arrows below outlet 18 in FIG. 7.

Figure 2:
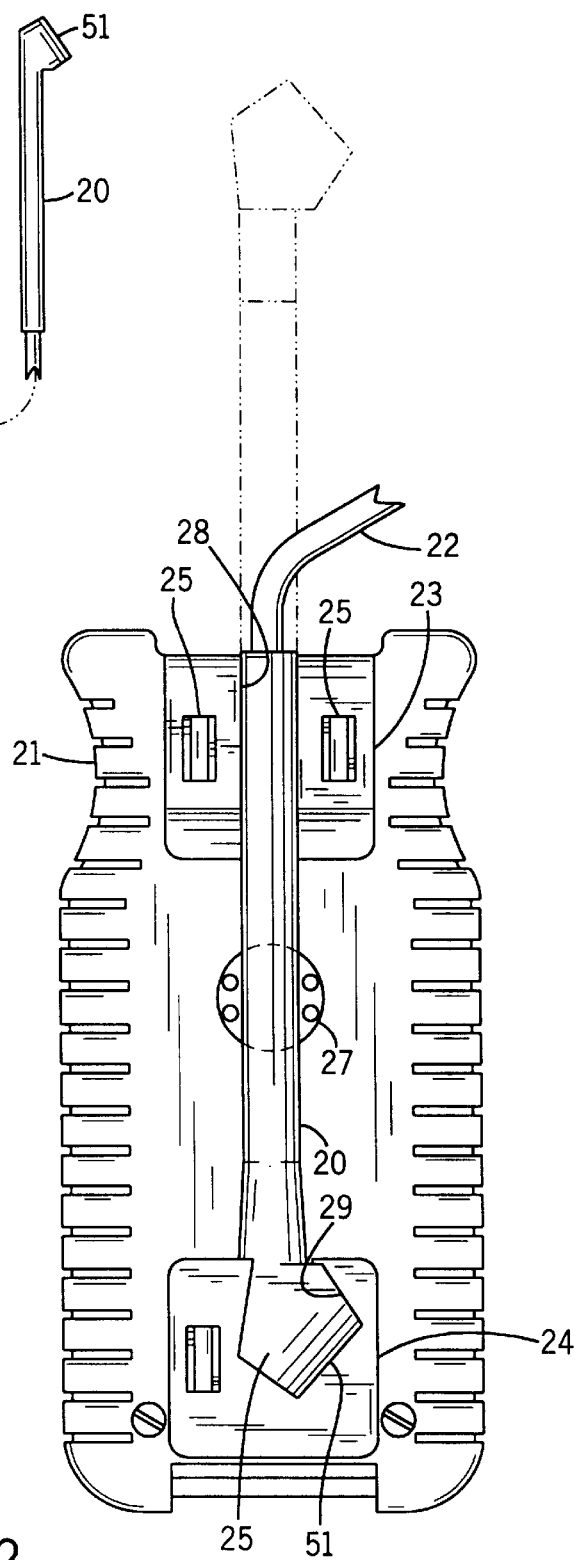
FIG. 2 is a rear plan view of the electrical circuit finder of FIG. 1.

FIGS. 1 and 2 illustrate a receiver 40 of the invention, which includes a probe wand 20 and receiver housing 21. The probe wand 20 and housing 21 are also schematically illustrated in FIG. 7. The wand 20 is connected to the housing 21, and more specifically to a circuit inside the housing, by a pair of wires of insulated electrical cord 22.

Figure 5:
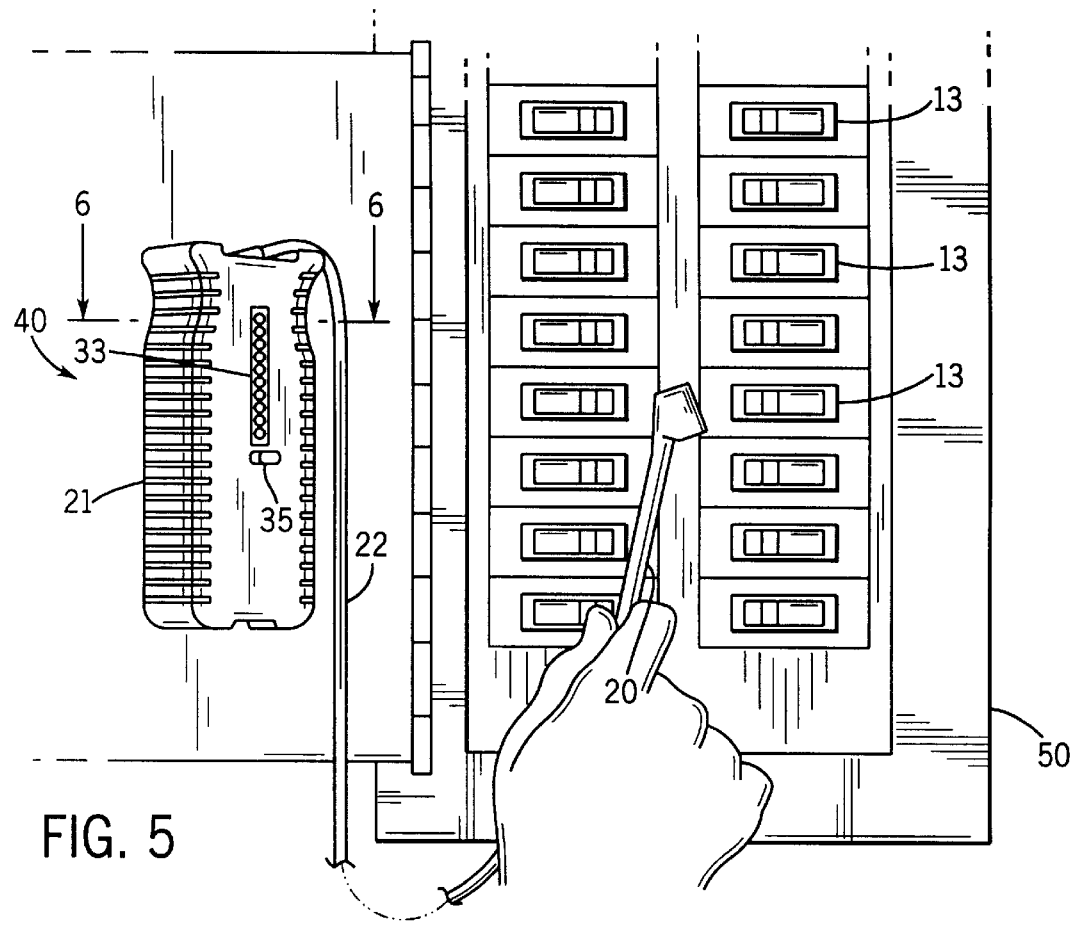
FIG. 5 is a view similar to FIG. 3 illustrating another way of using the finder.
Figure 6:
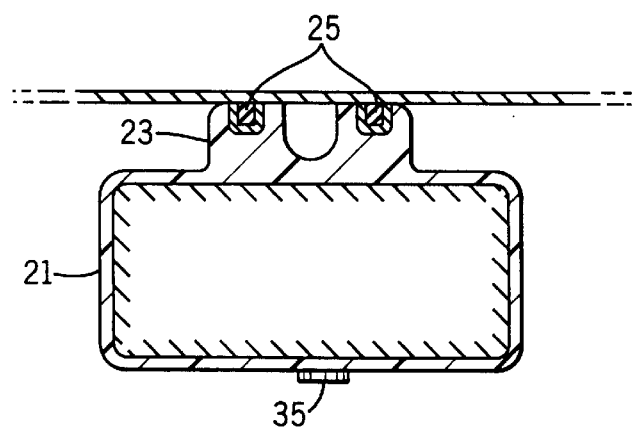
FIG. 6 is a partial cross-sectional view from the plane of the line 6—6 of FIG. 5.

The housing 21 has feet 23 and 24 in which magnets 25 are secured (FIG. 6). The housing 21 can be affixed by the magnets 25 to the metal door of the circuit breaker box 50 as illustrated in FIG. 5, when the distal end (the end opposite from the cord 22) of the probe wand 20 is passed over the circuit breakers 13. In that position, a row of indicator lights 33 (LED's) on the front of the housing 21 is readily visible to the user. The indicator lights 33, together with an audible signal created by the receiver 40 which comes out through the speaker grill 27 on the back of the housing 21, signals to a user which of the breakers 13 is connected to the outlet the transmitter is plugged into as described below.

Alternatively, the upper foot 23 can be provided with a semi-circular longitudinal groove 28 into which the cylindrical handle of the probe wand 20 can be frictionally held, for one handed operation in the position of FIG. 3. When the probe wand 20 is not being used, it can be stored with its distal end held in the similarly shaped recess 29 in lower foot 24. The housing 21 is preferably made of, or is covered with, a rubbery soft plastic material, which has some "give" to it, to securely hold the probe wand 20 in frictional contact when it is placed in the recesses 28 and 29. A switch 35 is also provided to turn the receiver 40 on and off, so as to preserve its battery power supply.

If a user wishes to determine which circuit breaker is associated with the receptacle 18, the user plugs the transmitter 19 into the outlet 18 (FIG. 4). The receiver 40 is then used to find the correct circuit breaker 13. The distal end of the probe wand 20 is passed over the circuit breakers 13 and audio and visual indicators from the housing 21 are observed. Maximum sound and a maximum reading on the visual display of lights 33 produced by the receiver 40 will occur when the distal end of the probe wand 20 is on top of the breaker 13 that has the transmitter 19 connected to it.

When probing with the wand 20, the wand 20 should be oriented with its distal surface 51 parallel to and in close proximity to the facing surface of the circuit breakers to get the best readings.

Figure 8:
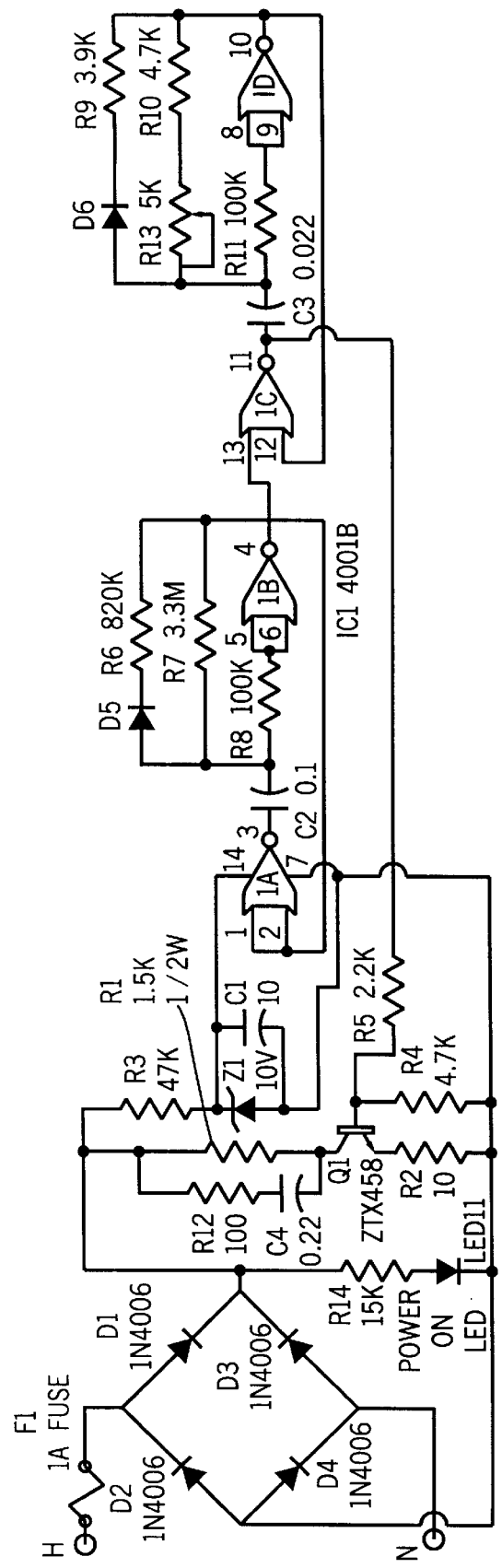
FIG. 8 is a schematic diagram of a circuit for a finder transmitter of the invention.

Referring to FIG. 8, there is illustrated a schematic diagram of a circuit for the transmitter 19, which is housed in the plastic housing of the transmitter 19. Power for the circuit enters on the left side through the prongs H and N of the transmitter 19, which are plugged into the outlet 18. Power is expected to be nominally 120 VAC at 60 Hz. It should be noted that this circuit could be easily modified by those skilled in the art to handle different voltages and/or power frequencies such as 230 VAC or 50 Hz. A full wave bridge formed from diodes D1, D2, D3 and D4 provide full wave AC voltage to the circuit. R14 and LED 11 provide a power "on" indicator, LED 11 also being identified by reference numeral 10 in FIG. 3. Components R3, Z1 and C1 form a simple AC to DC power supply for purposes of powering the CMOS integrated circuit IC1.

IC1 has four 2-input NOR gates 1A, 1B, 1C and 1D. Other logic gates could also be used as well as one-shot timer integrated circuits in alternate implementations. 1A and 1B together with components C2, D5, R6, R7 and R8 form a low frequency oscillator which produces an asymmetrical waveform of a frequency of about 2 to 3 hertz. The output of the low frequency oscillator at gate 1B pin 4 is connected to pin 13 of gate 1C and acts as a switch to enable and disable gate 1C. For example, when the output of gate 1B pin 4 is low, gate 1C is enabled, while when it is high gate 1C is disabled. Gates 1C and 1D together with components C3, R11, R13, D6, R9 and R10 form a gated oscillator that is controlled by the output of gate 1B pin 4 of the aforementioned low frequency oscillator. The gated oscillator operates at a frequency of 3950 Hz, but could be modified to operate at other frequencies.

The output of the gated oscillator at gate 1C pin 11 is coupled to transistor Q1 via resistor R5 so that transistor Q1 acts as a current modulator. Resistor R4 is used to maintain a consistent bias on Q1. The result is that transistor Q1 is turned on and off in accordance with the signal at gate 1C pin 11. Resistor R2 is connected to the emitter of Q1 and is used to help limit the current in Q1. Resistor R1 is located in the collector circuit of Q1 is also used to limit the current in Q1. Resistor R12 and capacitor C4 are located in the collector circuit of Q1 in parallel with resistor R1 and are used to help provide a fast transient response. The current in Q1 will be similar to the signal of the output of the gated oscillator at gate 1C pin 11. Resistor R13 is adjusted to produce a tone frequency of 3950 Hz+/−50 Hz.

Referring to FIG. 9, a portion of the current versus time waveform between the H and N terminals of the transmitter 19 is illustrated. As seen in FIG. 9, the waveform 30 consists of individual pulses 31 of current at a frequency of 3950 Hz. that have a sinusoidal envelope in accordance with the envelope of the 60 Hz. power frequency. There are a number of cycles of these modulated 60 Hz. current signals when the signal is ON and none when the signal is OFF. The ON and OFF times are dependent on the frequency of the low frequency oscillator of FIG. 8, usually around 2 or 3 Hz. When heard through the speaker of the receiver 40, this sounds somewhat like the sound of a cricket chirping.

Because of the pulsating nature of the current, the heating of Q1 and related components is made low enough such that low power rated components may be used. However, the current pulses are large enough to be detected by an inductive pick-up, tuned amplifier and filter at the power distribution panel, which is provided by the receiver 40 circuit illustrated in FIG. 10.

Figure 10:
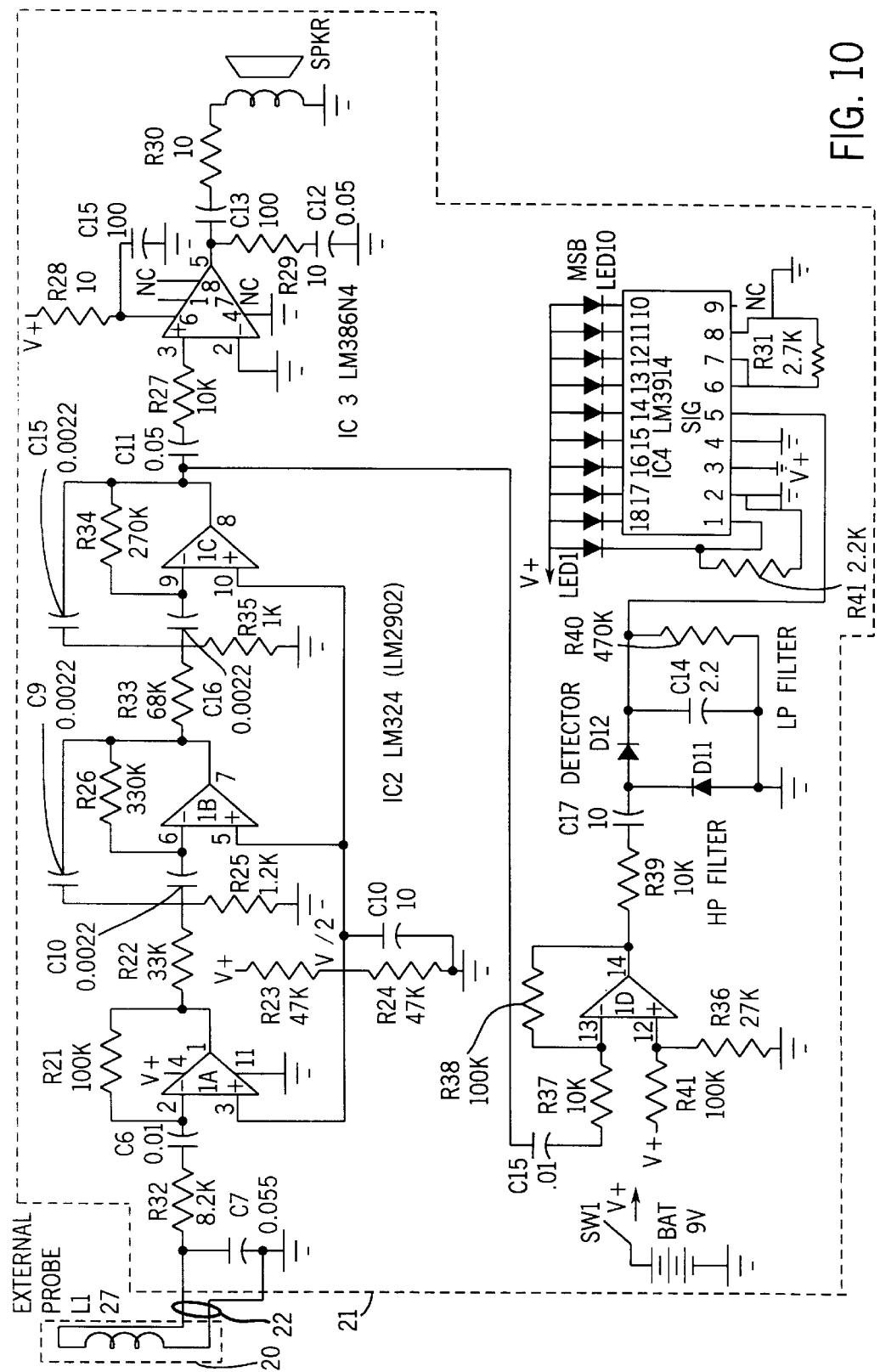
FIG. 10 is a schematic diagram of a circuit for a finder receiver of the invention.

Referring to FIG. 10, the circuit of the receiver 40 has an inductive pick-up coil L1 housed in the distal end of the probe wand 20, which is preferably plastic. The cord or cable 22 connects the inductive pick-up L1 in parallel with capacitor C7, which is part of the circuit board inside the housing 21, along with the other components illustrated in FIG. 10. Making the wand 20 separate from the housing 21 and only housing the inductive pick-up in the wand 20 permits making the wand 20 relatively small, for an accurate indication when probing relatively closely spaced circuit elements, such as a bank of circuit breakers. Capacitor C7 and pick-up L1 form a tuned circuit at the higher frequency of the transmitter, in this case 3950 Hz. The signal is further processed by active band pass filters, consisting of IC2 and the related illustrated components, also centered at 3950 Hz . The filter output is at pin 8 of IC2. An audio amplifier IC3 further amplifies this signal and produces sound by means of the loudspeaker SPKR, previously mentioned.

The processed signal at pin 8 of IC2 also goes to section 1D of IC2 for further processing, where it is high pass filtered and rectified. This is followed by low pass filtering which leaves a low frequency pulsating signal across C14. The resultant pulsating signal is then fed to pin 5 of IC4, which is a voltage to signal level converter. IC4 has the LEDs 33 connected to it. As the voltage input to pin 5 of IC4 varies, so does the number of LEDs 33 that light up. When the signal at pin 5 of IC4 is a minimum (with switch 35 on), only LED1 (which is the lowest light in the LED bank 33) will light. When the signal is a maximum, all LEDs including LED10 (the highest light) will light. Hence the pulsating voltage at the input of IC4 will cause the various LEDs connected to it to light depending on the amplitude of the voltage. This produces a visual indication of the strength of the signal. The strength of the signal will vary as the pick-up L1 is passed over the power panel and will clearly indicate which breaker is carrying the signal from the transmitter. The sound emitted by the receiver will also be the loudest at this point.

Thus, the number of lights lit, and the loudness, tone and frequency of the audible signal are used to signal to the user of the finder which circuit breaker 13 controls the receptacle 18 which the transmitter 19 is plugged into. The tone and frequency are distinct from the tone and frequency induced in the power lines by any electrical equipment, such as florescent lights or motor controllers, which is normally connected to a building's electrical system.

The circuit finder can also be used to associate other elements of an electrical circuit with one another which have the same current flowing through them. For example, if it was desired to determine which of several switches controlled a certain outlet, the transmitter would be plugged into the outlet, and the receiver used to detect which of the switches produced the distinctive light pattern and/or chirping sound when probed with the wand 20. Series connected outlets can also be associated with one another, by plugging the transmitter into one and probing for those connected to it. Other electrical equipment can also be probed so as to associate it with a particular circuit, such as light fixture wiring and other electrical devices. When probing of such devices, the user uses his/her visual and/or audio senses to distinguish the actual electromagnetic signature of the transmitter current flowing through the device being probed, from the residual RF signal produced in conductors of the system which are not in the transmitter circuit. Thus, the user may want to probe devices which she/he knows are not on the transmitter circuit to gain a reference for comparison puspose s.

In FIGS. 8 and 10, values and identifications are given for the various circuit elements. Values given for resistors are in ohms, and the resistors are ¼ W 5% resistors. The capacitors are 20% and values are in microfarads, and values of inductors are in millihenries. Diodes D5–D10 are 1N4148 and diodes D11 and D12 are 1N60 or equivalent. The values and elements identified are illustrative of the preferred embodiment of the invention. Other values or circuit elements may be used to practice the invention.

A preferred embodiment of the invention has been disclosed in considerable detail. Many variations and modifications will be apparent to persons skilled in the art which will embody the invention. Therefore, the invention is not limited to the embodiment described, but is defined by the claims which follow.

We claim:

1. In an electrical circuit finder for associating elements of an electrical circuit with one another in a building which contains multiple electrical circuits, said finder including a transmitter and a receiver, said transmitter being connected to one of said elements of said circuit at a location remote from another element of said circuit which is to be associated with said one of said elements, and said receiver including a sensor for placing in proximity to said other element to signal that said element is on the same circuit as said one element, the improvement wherein:

said transmitter has an electrical current signal generator including a low frequency oscillator operating at a certain frequency, a high frequency gated oscillator modulated by said low frequency oscillator, and a current modulator, said oscillators and current modulator being connected so as to induce a current signal in said circuit of said high frequency which is modulated at said low frequency; and said receiver has a circuit including an inductive pick-up which is tuned to said high frequency so as to induce in said pick-up a current of said high frequency when said pick-up is excited by a magnetic field of said circuit and a relative signal strength indicator which signals to the user of the receiver a human perceptible signal which varies in accordance with the magnitude of said current in said pick-up, said relative signal strength indicator being energized and deenergized cyclically at a frequency equal to the frequency of the low frequency oscillator.

2. The improvement of claim 1, wherein said relative signal strength indicator includes a visual display having a line of lights which are sequentially energized and deenergized cyclically at said frequency of said low frequency oscillator, the total number of lights energized in any single cycle being proportional to the magnitude of current in said pick-up.

3. The improvement of claim 1, wherein said relative signal strength indicator includes an audio output device which produces a series of sounds which are produced cyclically at said frequency of said low frequency oscillator, the volume of said sounds being proportional to the magnitude of current in said pick-up.

4. The improvement of claim 1, wherein said low frequency is 2–3 Hz.

5. The improvement of claim 1, wherein said circuit of said receiver further includes a tuned bandpass filter for signal enhancement in noise.

6. The improvement of claim 1, wherein said circuit of said receiver further includes a signal detector and a high pass filter.

7. The improvement of claim 1, wherein said inductive pick-up is housed in a wand and said relative signal strength indicator is housed in a receiver housing which is separate from said wand.

8. The improvement of claim 7, wherein said wand is connected to said receiver housing by a cable.

9. The improvement of claim 8, wherein said receiver housing includes magnets by which said housing can be affixed to a vertical steel surface.

10. The improvement of claim 9, wherein said magnets are provided in feet on a rear surface of said housing.

11. The improvement of claim 10, wherein said feet are formed with recesses in which said wand may be stored.

12. The improvement of claim 11, wherein said wand can be held in one or more of said recesses in an extended position in which said wand is exposed to probe a circuit.

13. The imrpovement of claim 1, wherein said transmitter has a pair of prongs so that it can be plugged into a wall outlet.

* * * * *